United States Patent [19]

Hyodo et al.

[11] Patent Number: 4,873,556
[45] Date of Patent: Oct. 10, 1989

[54] HETERO-JUNCTION DEVICE

[75] Inventors: Kenji Hyodo, Drexel Hill, Pa.; Hiroshi Koezuka, Nishinomiya, Japan; Alan G. MacDiarmid, Drexel Hill, Pa.

[73] Assignee: Mitsubishi Denki Kabushiki Kaisha, Japan

[21] Appl. No.: 178,828

[22] Filed: Mar. 25, 1988

Related U.S. Application Data

[63] Continuation of Ser. No. 731,282, May 7, 1985, abandoned, which is a continuation of Ser. No. 052,227, May 15, 1987, abandoned.

[51] Int. Cl.$^4$ ............................................. H01L 29/28
[52] U.S. Cl. .......................................... 357/8; 357/16; 252/62.3 Q
[58] Field of Search ................ 357/8, 16; 252/62.3 Q; 136/263

[56] References Cited

U.S. PATENT DOCUMENTS

| | | | |
|---|---|---|---|
| 4,106,951 | 8/1978 | Masi | 357/16 X |
| 4,204,216 | 5/1980 | Heeger et al. | 357/8 |
| 4,427,840 | 1/1984 | Waldrop et al. | 357/8 X |
| 4,472,488 | 9/1984 | Maxfield et al. | 429/122 X |
| 4,663,001 | 5/1987 | Lazzaroni et al. | 357/294 X |

FOREIGN PATENT DOCUMENTS

| | | |
|---|---|---|
| BE899925 | 10/1984 | Belgium. |
| 0124702 | 11/1984 | European Pat. Off. ........ 252/62.3 Q |
| 0145843 | 6/1985 | European Pat. Off. ........ 252/62.3 Q |
| 2373166 | 8/1978 | France ....................... 357/8 |
| 55-130182 | 10/1980 | Japan ....................... 357/16 |
| 55-138870 | 10/1980 | Japan ....................... 357/16 |

OTHER PUBLICATIONS

Roberts, W. P., and Schulz, L. A., "Polypyrrole Formation at a Polyacetylene Electrode", ACS Polymer Preprints V25, No. 2, 8184, pp. 253–254.

Webster's Ninth New Collegiate Dictionary, Merriam-Webster Inc., Publ. Springfield, Mass., 1984, pp. 567, 654.

Skotheim, T. A., Feldberg, S. W., and Armand, M. B, "Polypyrrole Electrodes, Charge Transfer to Aqueous and Solid Polymer Electrolytes", J. de Physique Colloque C3, Supplement No. 6, V44, 6/83, pp. 615–620.

Skotheim, T., Inganäs, O., Prejza, J., and Lundström, I. "Polypyrrole–Semiconductor Photovoltaic Devices", Mol. Cryst. Liq. Cryst., 1982, V83, pp. 329–339.

Primary Examiner—Andrew J. James
Assistant Examiner—Sara W. Crane
Attorney, Agent, or Firm—Leydig, Voit & Mayer

[57] ABSTRACT

The present invention relates to a hetero-junction device comprising a hetero-junction formed at the interface of two π-conjugated system polymers (A) and (B) wherein on the first π-conjugated system polymer (A) a second π-conjugated polymer (B) different from said polymer (A) is deposited thereby making it possible to control junction properties by altering the quantity of doping to the polymer.

12 Claims, 3 Drawing Sheets

1: SUBSTRATE
2: METAL LAYER
3,4: π-CONJUGATED SYSTEM POLYMER
5: UPPER METAL LAYER

1: SUBSTRATE
2: METAL LAYER
3,4: $\pi$-CONJUGATED SYSTEM POLYMER
5: UPPER METAL LAYER

HETERO-JUNCTION DEVICE

This application is a continuation of application Ser. No. 731,282, filed May 7, 1985, now abandoned, which is a continuation of application Ser. No. 052,227, filed May 15, 1987 now abandoned.

BACKGROUND OF THE INVENTION

The present invention relates to a novel heterojunction device using $\pi$-conjugated system polymer material as semiconductor materials.

It is thought that $\pi$-conjugated system polymers comprise conjugated double bonds in their chemical structural skeleton and have a band structure consisting of a valence band formed by overlapping bonding $\pi$-electron orbitals, conduction bands formed from antibonding $\pi$-electron orbitals and a band gap which separates the two bands. Since the band gap is in the range of 1.5–4 eV depending on the material, $\pi$-conjugated system polymers themselves are insulators. However, it is believed that carriers which transport charges are produced either by extracting electrons from the valence band (oxidation) or by injecting electrons into the conduction band (reduction) by means of chemical methods, electrochemical methods or the like (hereinafter referred to as doping). As a result, the conductivity of said $\pi$-conjugated system polymers can be varied at will, over a mid range from the insulator region regime to the metal region regime by controlling the quantity of doping. When doping is performed by an oxidizing reaction, p-type polymers are produced, while reducing reactions produce n-type polymers. This relationship is similar to the addition of an impurity in an inorganic semiconductor. Because of this fact, it is possible to produce a semiconductor device using a $\pi$-conjugated system polymer as the semiconductor material.

For example, a Schottky type junction device using polyacetylene (*J. Appl. Phys.* vol. 52, p. 869, 1984; Japanese patent application Laid-Open No. 56-147486, etc.) and a Schottky type junction device using a polypyrrole conjugated polymer (Japanese patent application Laid-Open No. 59-63760) have been heretofore known. A hetero-junction device prepared by combining n-CdS as an inorganic semiconductor with p-type polyacetylene has also been reported (*J. Appl. Phys. vol.* 51, P. 4252, 1980). A p-n homo junction device using p-type and n-type polyacetylene prepared by combining $\pi$-conjugated system polymers themselves together has also been known (*J. Appl. Phys. Lett.* vol. 33, P. 18, 1978). This junction device however, is unstable even under the atmosphere of dried helium, leading to the loss of junction properties within a few hours.

In the above described conventional semiconductor device using $\pi$-conjugated system polymers, most junctions are conbinations of $\pi$-conjugated system polymers and a metal or of $\pi$-conjugated system polymers and an inorganic semiconductor. The former is the Schottky type junction device which, although easy to prepare, is unstable during operation. For example, in the Schottky type junction formed between a p-type polypyrroleconjugated system polymer and indium, the junction properties thereof deteriorate even in a vacuum due to the reaction of the p-type dopant with indium (*J. Appl. Phys.*, 56, p. 1036 (1984)).

As mentioned above, in a p-n homo junction device using p-type and n-type polyacetylene prepared by combining $\pi$-conjugated system polymers themselves, the junction properties thereof deteriorate even in an inert atmosphere. This is because the mutual diffusion of p-type dopant anions and n-type dopant cations occurs at the interface of a p-n homo junction device which combines p-doped polyacetylene with n-doped polyacetylene (*Appl. Phys. Lett.*, 33, p. 18 (1978)). Therefore, it was believed that a stable junction device prepared by combining $\pi$-conjugated system polymers could not be formed because of the mutual diffusion of dopant ions occurring through the interface of the polymers by depositing two kinds of $\pi$-conjugated system polymers. Moreover, it was believed that a stable junction device, in which the junction properties thereof were controlled on the basis of the amount of doping to $\pi$-conjugated system polymers could not be formed.

SUMMARY OF THE INVENTION

Accordingly, an object of the present invention is to provide a hetero-junction device in which a first layer of a $\pi$-conjugated system polymer is disposed on a second layer of a $\pi$-conjugated system polymer which is different from the first polymer, an amount of doping of at least one of the polymers being controlled to thereby form a hetero-junction at the interface of the first and second $\pi$-conjugated system polymers. The junction properties of the hetero-junction device can be controlled by the amount of doping of at least one of the first and second polymers and, as a result, the hetero-junction presents a non-ohmic behavior in a solid state condition. Furthermore, the hetero-junction device according to the present invention can be operated stably for a long period of time.

In order to achieve the above objects, the hetero-junction device according to the present invention comprises a hetero-junction formed at the interface of a $\pi$-conjugated system polymer (A) and a $\pi$-conjugated system polymer (B), the $\pi$-conjugated system polymer (B) being deposited on the polymer (A) and being different from the polymer (A) and the hetero-junction presenting a non-ohmic behavior in a solid state condition.

SUMMARY OF THE INVENTION

This invention resides in a hetero-junction device comprising a hetero-junction formed at the interface of a $\pi$-conjugated system polymer (A) and a $\pi$-conjugated system polymer (B), said $\pi$-conjugated system (B) being deposited on said polymer (A) and being different from said polymer (A).

The present invention further relates to a method of producing a hetero-junction device comprising depositing a layer of $\pi$-conjugated system polymer (A) at least on a metal layer disposed on a substrate, depositing a layer of $\pi$-conjugated system polymer (B) on the layer of $\pi$-conjugated system polymer (A) said polymer (B) being different from said polymer (A), thereby forming a hetero-junction at the interface of said polymers (A) and (B).

DESCRIPTION OF THE PREFERRED EMBODIMENTS

Figure 1:
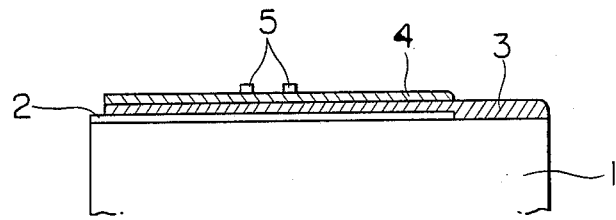
FIG. 1 represents a side view of a hetero-junction device according to this invention.
Figure 2:
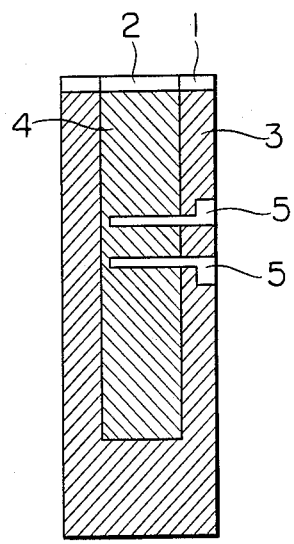
FIG. 2 represents a plan view of a hetero-junction device according to this invention.

FIGS. 1 and 2 show schematic views of one embodiment of a hetero-junction device according to this invention by way of example only. FIG. 1 depicts a side view of the junction device, and FIG. 2 depicts a plan view of the junction device. In the Figures, reference numbers 1 and 2 indicate a substrate and metal layer provided on the substrate 1, respectively. The reference numbers 3 and 4 represent $\pi$-conjugated system polymer layers and 5 is a metal layer as an upper electrode. Any insulating material such as glass, sintered alumina, and any kind of insulating plastics can be used as a substrate 1. If the $\pi$-conjugated system polymers contacting the metal layers 2 and 5 respectively are p-doped type, the metal layers may be composed of a high work function metal such as platinum, gold, chromium and the like for ohmic contact, while if the $\pi$-conjugated system polymers are doped as an n-type, low work function metals such as indium, aluminum and the like can be used. For the preparation of the metal layer or layers there may be mentioned, for example, vapor deposition, sputtering, plating, CVD growth techniques and the like. Depending upon the intended application, an inorganic semiconductor or metal plate may be used concurrently as a substrate and metal layer in place of a combined substrate 1 and metal layer 2.

As the $\pi$-conjugated system polymer any $\pi$-conjugated system polymer can be used in accordance with this invention. Examples of these $\pi$-conjugated polymers include polyacetylene, polypyrrole, poly (N-substituted)pyrrole, polythiophene, poly (3-substituted)thiophene, poly (3,4-disubstituted)thiophene, polyaniline, polyazulene, polypyrene, polycarbozole, poly (N-substituted)carbozole, polyfuran polybenzothiophene, polybenzofuran, poly (paraphenylene), polyphenylenesulfide, polyindole and the like. The $\pi$-conjugated system polymer is not, of course, limited to the above. From the standpoint of filmforming ability, polyacetylene, polypyrrole, and poly (N-substituted pyrrole) are preferred and among the poly (N-substituted pyrrole)'s poly (N-methyl)pyrrole is preferable from the standpoint of semiconductor characteristics. The layer of $\pi$-conjugated system polymer layer 3 can be applied to the metal layer 2 by directly synthesizing it on the metal layer 2 by polymerization with the use of a catalyst, by electrochemical polymerization, or by application from a vapor phase such as vapor deposition, sputtering, CVD growth techniques, etc. The $\pi$-conjugated system polymer 4 is also prepared similar to the layer of the $\pi$-conjugated system polymer 3. In synthesizing polypyrrole and poly (N-substituted)pyrrole, an electrochemical polymerization technique and chemical polymerization technique with the use of an oxidizer may be used, the electrochemical polymerization technique being preferred from the standpoint of the characteristics of film thus obtained. When $\pi$-conjugated system polymer layer 3 is not doped, a film of polypyrrole or poly (N-substituted)pyrrole is easily provided only on the surface of $\pi$-conjugated polymer layer 3 with good junction characteristics by means of electrochemical polymerization techniques in an aqueous solution taking advantage of the water-repellant effect of the polymer layer 3. Doping is effected on at least one of the $\pi$-conjugated system polymer (A) or $\pi$-conjugated system polymer (B). As the doping agent to be used, a variety of reduction or a variety of oxidation reagents can be used. The hetero-junction device according to the present invention is useful for electrical components (for example, as an optical electronic element).

The present invention will be further illustrated by the following non-limiting Examples.

EXAMPLE 1

A chromium layer (about 200 Å thick, 1.1 cm×5.5 cm) was prepared on a slide glass (2.5 cm×7.5 cm) by means of a vacuum deposition technique, and on said chromium layer a gold layer (about 500 Å) was coated by the same vacuum deposition technique. A Ziegler polymerization catalyst (*Polymer J. vol.* 4, p. 460, 1973; *J. Plym. Sci. Polym. Chem. Ed. vol.* 12, p. 11, 1974) was prepared and aged for 16 hours (this catalyst can be used for about one mouth, if preserved in an inert gas atmosphere). The slide glass having a chromium-gold layer was placed in a reaction vessel made of glass, to which was poured a solution of said catalyst under an argon atmosphere. After cooling the catalyst solution to $-78°$ C., the vessel was evacuated to remove any dissolved gas in the solution, repeating the dissolved gas removal procedure.

The solution in the reaction vessel was then decanted at that temperature to leave a thin coated layer of catalyst solution on the chromium-gold layer of the slide glass. Thereafter a refined acetylene gas (about 100 Torr) was then introduced to the reaction vessel to contact the acetylene gas to the surface of the chromium-gold layer coated with the catalyst for about 15–25 seconds. Thus a polyacetylene film was synthesized on the slide glass. Unreacted acetylene gas was removed by a vacuum pump. Synthesized polyacetylene thus obtained was washed repeatedly with refined toluene under an argon atmosphere until the washed toluene effluent turned colorless. Any residual toluene was then removed by a vacuum pump. The resulting polyacetylene on the chromium-gold layer of the slide glass was substantially in a cis form. After transferring the slide glass to another glass vessel under an argon atmosphere, polyacetylene on the slide glass was isomerized by heating at 140°–150° C. for 1.5–2 hours under reduced pressure to a substantially trans-form.

Then, polyacetylene film was shaved 1–2 mm wide at its edge under an argon atmosphere to expose a full edge width surface of the metal layer as shown in FIG. 2 as the exposed metal layer 2 to which is attached an alligator clip for using it as a lead terminal in the following reactions.

A poly (N-methyl) pyrrole layer (hereinafter referred to as PNP) was synthesized onto the polyacetylene layer by an electrochemical polymerization (electrolytic polymerization) technique under an argon or nitrogen atmosphere, the synthetic procedure being illustrated in more detail hereinafter.

As the reaction solution for electrolytic polymerization, to 100 ml of water 1.6 g $CuSo_4.5H_2O$ was dissolved and further 0.6 g of N-methylphyrrole was added. The polyacetylene film on chromium-gold layers obtained as above and a copper plate (about 0.5 cm×2 cm) seperated about 3 cm from said polyacetylene film were immersed in said solution and the former was connected to a positive terminal of a direct current source as a working electrode while the latter to a negative terminal as a counter electrode. No reference electrode was used. A direct voltage of about 0.6–0.7 V was applied between both electrodes to pass through a direct current of about 100 mC/cm$^2$ for about 20–25 minutes. These procedures were all performed under an argon or nitrogen atmosphere. The resultant PNP-polyacetylenegold-chromium composite was then washed with water from which oxygen gas had been previously removed followed by immersing it without drying, in an aqueous solution containing 1 mol NaOH and 1 mol Na$_2$S$_2$O$_3$ for about 30 seconds. After washing the sample with water again, the sample was dipped in methanol for 2–3 seconds followed by drying in a vacuum. To the resulting sample, gold was vapor deposited about 500Å thick as upper electrodes 5 as shown in FIGS. 1 and 2. The distance between the pair of upper electrodes was 3 mm. Then lead wires were fixed to the gold upper electrodes 2 and 5 shown in FIGS. 1 and 2. The sample thus obtained was used in a measurement of current-voltage characteristics. This sample was identified as sample 1. The side view and plan view of this sample 1 are shown in FIGS. 1 and 2 respectively. In FIGS. 1 and 2, the slide glass is represented as 1, gold-chromium layer as 2, polyacetylene as 3, PNP as 4, and the upper gold electrode layer as 5. The contact area between upper gold electrode layer 5 and PNP is 0.1 cm$^2$.

EXAMPLE 2

A PNP-polyacetylene-gold-chromium composite was prepared as in Example 1 and the composite was then dipped in an aqueous solution containing one mol NaOH and one mol Na$_2$S$_2$O$_3$ for about 25 seconds followed by similar subsequent procedures as in Example 1. The product composite thus obtained, identified as Sample 2, was used to measure current-voltage characteristics.

EXAMPLE 3

A PNP-polyacetylene-gold-chromium composite was prepared as in Example 1, and was immersed in an aqueous solution containing one mol NaOH and one mol Na$_2$S$_2$O$_3$ for about 20 seconds followed by similar subsequent procedures as in Example 1. The product composite identified as Sample 3 was used to measure current-voltage characteristics.

EXAMPLE 4

This Example illustrates that PNP is a p-type material and exhibits an ohmic contact with gold having a high work function. Using a glass slide with a layer of gold/-chromium as in Example 1 deposited thereon, the PNP was directly synthesized on said gold-chromium layer using the method as in Example 1. After PNP synthesis, it was washed with water free from oxygen gas followed by immersion in methanol for 2–3 seconds. The sample was then dried in a vacuum. A gold electrode, 500Å thick was vapor deposited on the sample as an upper electrode as in Example 1. Upon measuring the current-voltage characteristics between the upper and lower gold electrodes of the PNP film, ohmic behavior was observed. This fact demonstrated that PNP is a p-type material, and provides ohmic contact with gold having a large work function.

Immersion of a PNP deposited composite in the aqueous solution containing 1 mol NaOH and 1 mol Na$_2$S$_2$O$_3$ for different periods of time (tp) in Examples 1–3 cause the doping state of PNP to vary. This is demonstrated by applying 1 volt between the upper gold electrodes spaced 3 mm apart and measuring the resistance. The results are shown in Table 1 below:

TABLE 1

Dependence of electric resistance (R, Ω) between the upper gold electrodes on tp

| Sample No. | tp (seconds) | R (Ω) |
| --- | --- | --- |
| 1 | 30 | $4 \times 10^{10}$ |
| 2 | 25 | $5 \times 10^8$ |
| 3 | 20 | $4 \times 10$ |

Figure 3:
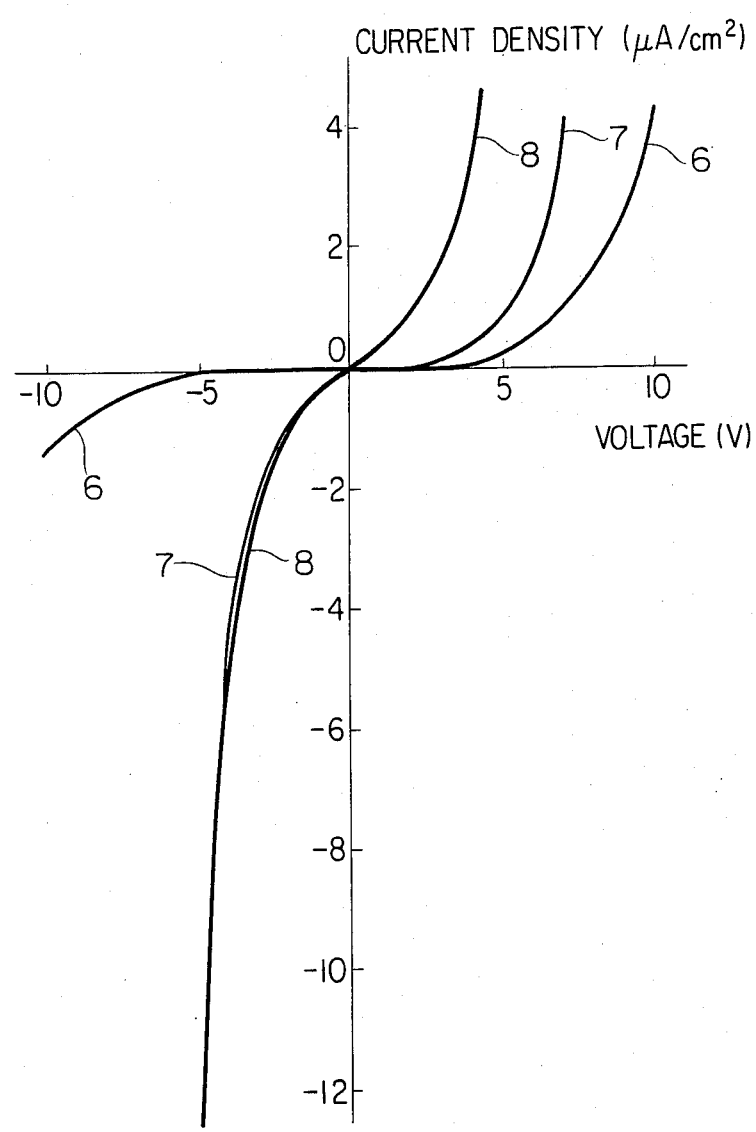
FIG. 3 represents a graph showing the relationship between the electrical current and voltage of the hetero-junction device prepared according to an embodiment of the invention.

FIG. 3 represents a graph showing the relationship between electrical current and voltage of the Sample 1, 2, and 3. The measurement was carried out between the lower gold electrode 2 and either one of the upper gold electrodes 5 in FIG. 1 under vacuum. Curves 6, 7, and 8 correspond to curves of the Samples 1, 2, and 3, respectively. The abscissa indicating applied voltage designates a positive voltage when a positive potential is applied to polyacetylene. The fact that there is ohmic contact between PNP and the gold layer is shown in Example 4. On the other hand ohmic contact between polyacetylene and the gold layer is already known (*J. Appl. Phys.* vol. 52, p. 869, 1981; *Jpn. J. Appl. Phys.* vol. 33, P. 499, 1980). Accordingly, as can be seen in FIG. 3 it was concluded that the non-ohmic behavior (rectification) is based on the electron state at the interface between polyacetylene and PNP.

Curve 6 shows that more current flows upon applying a positive voltage to the polyacetylene electrode than when applying a negative voltage to the same electrode. Now turning to Table 1, it can be seen that the amount of doping in the PNP in Sample 1 (curve 6) is very small, that is, the electric resistance (R) measured at the surface of the PNP is the greatest.

The amount of doping in the PNP in Samples 2 and 3 is more than that of Sample 1 and as a result the current-voltage characteristic curves significantly differ from that of Sample 1, that is, curve 7, a current-voltage characteristic curve of Sample 2, shows, in contrast to curve 6, that much more electric current flows when applying a negative to the polyacetylene side than when applying a positive voltage to the same side.

Curve 8 is substantially the same as curve 7. From the foregoing, it can be seen that the electric current-voltage characteristics in the polyacetylene-PNP element can be controlled by altering the quantity of doping to the PNP.

EXAMPLE 5

Figure 4:
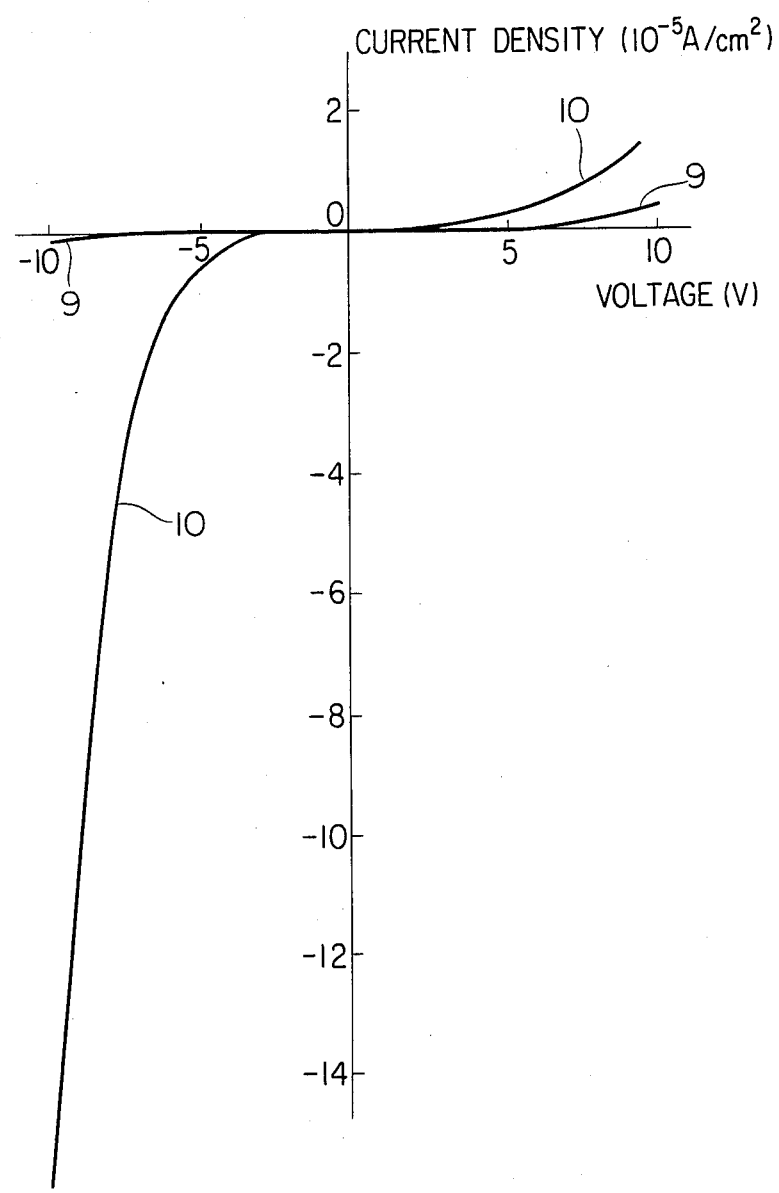
FIG. 4 represents a graph showing the relationship between the electrical current and voltage when a sample 1 is doped with $HClO_4$ according to an embodiment of this invention.

Sample 1 as prepared in Example 1 was exposed to a vapor of an aqueous solution of 12 mols HClO$_4$ under continuous vacuum conditions at room temperature. By applying one volt between the two upper gold electrodes the variation of resistance was measured. When resistance reached $3.5 \times 10^8 \Omega$, the exposure of the sample to the vapor of HClO$_4$ was halted. The sample was then left to stand under continued vacuum conditions for 16 hours. The resistance of the sample thus obtained which is referred to as sample 4 was $3.8 \times 10^8 \Omega$. In FIG. 4 electric current-voltage characteristic curves of Samples 1 and 4 are shown. The current density plotted at the positive voltage is that measured when a positive voltage is applied to the polyacetylene side. Curves 9 and 10 represent the current-voltage characteristic curves of Samples 1 and 4 respectively. Curve 9 is only reproduced here from curve 6 in FIG. 3. It can be seen from FIG. 4 that the electric current-voltage characteristic curve is drastically altered by the doping of HClO$_4$ in PNP, namely that more current can flow in Sample 4 as shown in curve 10 when a negative voltage is applied while in Sample 1 as shown in curve 9 more current can flow when applying positive voltage to the polyacetylene side than when a negative voltage is applied to the same. Thus, the current-voltage characteristic curve 10 is essentially the same as curve 7 in FIG. 3, and this essential identity of these curves corresponds to substantially the same resistance between the two upper gold electrodes of $5\times10^{-8}\Omega$ for sample 2 and of $3.5\times10^8$ for sample 4. This fact demonstrates that a given quantity of doping to PNP regardless of whether or not the means for the doping are different from one doping to another, can provide the same electric current-voltage properties. Moreover, after preserving sample 4 for 3 days under a dry argon atmosphere, it reproduced substantially the same electric current-voltage curve as previously measured curve 10 indicating that the diffusion of the dopant ion does not occur through the interface of the polyacetylene and PNP. Therefore, the heterojunction device according to the present invention has very superior stability in contrast to that of the conventional p-n homo junction device which combines p-type polyacetylene with n-type polyacetylene.

While a few presently preferred embodiments and examples of the present invention have been shown and described herein, it will be apparent to those skilled in the art that various changes and/or modifications thereof can be made without departing from the spirit and scope of the invention as defined in the appended claims.

What is claimed is:

1. A hetero-junction device comprising a heterojunction formed at the interface of a $\pi$-conjugated system polymer (A) and a $\pi$-conjugated system polymer (B), said $\pi$-conjugated system polymer (B) being deposited on said polymer (A) and being a different polymer from said polymer (A) to provide a non-ohmic behavior in a solid state condition.

2. The hetero-junction device according to claim 1 wherein said $\pi$-conjugated system polymer (A) is at least disposed on a metal layer 90 which itself is deposited on a substrate, said metal layer being capable of being brought into ohmic contact with said polymer (A) and said $\pi$-conjugated system polymer (B) having a metal layer provided upon it capable of being brought into ohmic contact with said polymer (B).

3. The hetero-junction device according to claim 1 wherein said $\pi$-conjugated system polymer (A) is polyacetylene and said $\pi$-conjugated system polymer (B) is polypyrrole.

4. The hetero-junction device according to claim 1 wherein said $\pi$-conjugated system polymer (A) is polyacetylene and said $\pi$-conjugated system polymer (B) is poly (N-substituted) pyrrole.

5. The hetero-junction device according to claim 3 wherein said polypyrrole is that produced by an electrochemical polymerization technique.

6. The hetero-junction device according to claim 4 wherein said poly (N-substituted) pyrrole is that produced by an electrochemical polymerization technique.

7. The hetero-junction device according to claim 5 wherein said polypyrrole is that produced by an electrochemical polymerization in an aqueous solution.

8. The hetero-junction device according to claim 6 wherein said poly (N-substituted) pyrrole is that produced by an electrochemical polymerization in an aqueous solution.

9. The hetero-junction device according to claim 6 or 8 wherein said poly (N-substituted) pyrrole is poly (N-methyl) pyrrole.

10. The hetero-junction device according to claim 9 wherein at least one of said $\pi$-conjugated polymers (A) and (B) is doped.

11. The hetero-junction device according to claim 1 wherein at least one of said $\pi$-conjugated polymers (A) and (B) is doped.

12. The hetero-junction device according to claim 2 wherein at least one of said $\pi$-conjugated polymers (A) and (B) is doped.

* * * * *

UNITED STATES PATENT AND TRADEMARK OFFICE
CERTIFICATE OF CORRECTION

PATENT NO.  : 4,873,556
DATED       : October 10, 1989
INVENTOR(S) : Kenji Hyodo, Hiroshi Koezuka, Alan G. MacDiarmid It is certified that error appears in the above-identified patent and that said Letters Patent is hereby corrected as shown below:

On the title page:

[73] Assignee: Mitsubishi Paper Mills, Ltd., Japan
and Mitsubishi Denki Kabushiki Kaisha, Japan Signed and Sealed this Twenty-sixth Day of February, 1991

Attest:

HARRY F. MANBECK, JR.

Attesting Officer    Commissioner of Patents and Trademarks